United States Patent
Okada

(10) Patent No.: US 10,745,956 B2
(45) Date of Patent: Aug. 18, 2020

(54) TOUCH SENSOR UNIT AND METHOD OF MANUFACTURING THE SAME

(71) Applicant: Mitsuba Corporation, Gunma (JP)

(72) Inventor: Mitsuhiro Okada, Gunma (JP)

(73) Assignee: MITSUBA CORPORATION, Gunma (JP)

( * ) Notice: Subject to any disclaimer, the term of this patent is extended or adjusted under 35 U.S.C. 154(b) by 609 days.

(21) Appl. No.: 15/590,095

(22) Filed: May 9, 2017

(65) Prior Publication Data

US 2017/0328112 A1 Nov. 16, 2017

(30) Foreign Application Priority Data

May 10, 2016 (JP) .................. 2016-094681

(51) Int. Cl.
| | | |
|---|---|---|
| E05F 15/40 | (2015.01) | |
| H03K 17/975 | (2006.01) | |
| E05F 15/44 | (2015.01) | |
| H03K 17/96 | (2006.01) | |
| E05F 15/42 | (2015.01) | |
| G01D 5/14 | (2006.01) | |
| G01D 11/24 | (2006.01) | |
| B60J 5/10 | (2006.01) | |

(52) U.S. Cl.
CPC .............. *E05F 15/40* (2015.01); *E05F 15/42* (2015.01); *E05F 15/44* (2015.01); *G01D 5/14* (2013.01); *H03K 17/96* (2013.01); *H03K 17/962* (2013.01); *H03K 17/975* (2013.01); *B60J 5/10* (2013.01); *E05Y 2900/546* (2013.01); *G01D 11/24* (2013.01); *H03K 2217/96015* (2013.01)

(58) Field of Classification Search
CPC . E05F 15/40; E05F 15/42; G01D 5/14; H03K 17/96
USPC ...................................................... 200/61.44
See application file for complete search history.

(56) References Cited

U.S. PATENT DOCUMENTS

| | | | | |
|---|---|---|---|---|
| 6,260,418 B1 * | 7/2001 | Ishihara | ................. | H01H 3/142 73/756 |
| 2011/0047879 A1 * | 3/2011 | Shimizu | .................. | E05F 15/44 49/358 |
| 2012/0267914 A1 * | 10/2012 | Thiele | ........................ | B60J 5/06 296/146.9 |

FOREIGN PATENT DOCUMENTS

| | | |
|---|---|---|
| JP | 2006016890 A | 1/2006 |
| JP | 2009236769 A | 10/2009 |
| JP | 2013-92019 A | 5/2013 |
| WO | 2015194030 A1 | 12/2015 |

* cited by examiner

*Primary Examiner* — Nguyen Tran
*Assistant Examiner* — Iman Malakooti
(74) *Attorney, Agent, or Firm* — McCormick, Paulding & Huber PLLC

(57) ABSTRACT

In a touch sensor unit, since a base portion is provided with a hard resin portion for holding a curved state of a sensor portion deformed in conformity to a curved shape of a door frame of a tail gate, even when the base portion is not fixed to the tail gate, it is possible to hold the curved state of the base portion. Therefore, after the curved base portion is fixed to the tail gate with a double-sided adhesive tape, even if the double-sided adhesive tape is degraded with age, a restoring force of the sensor portion does not remove the double-sided adhesive tape.

4 Claims, 9 Drawing Sheets

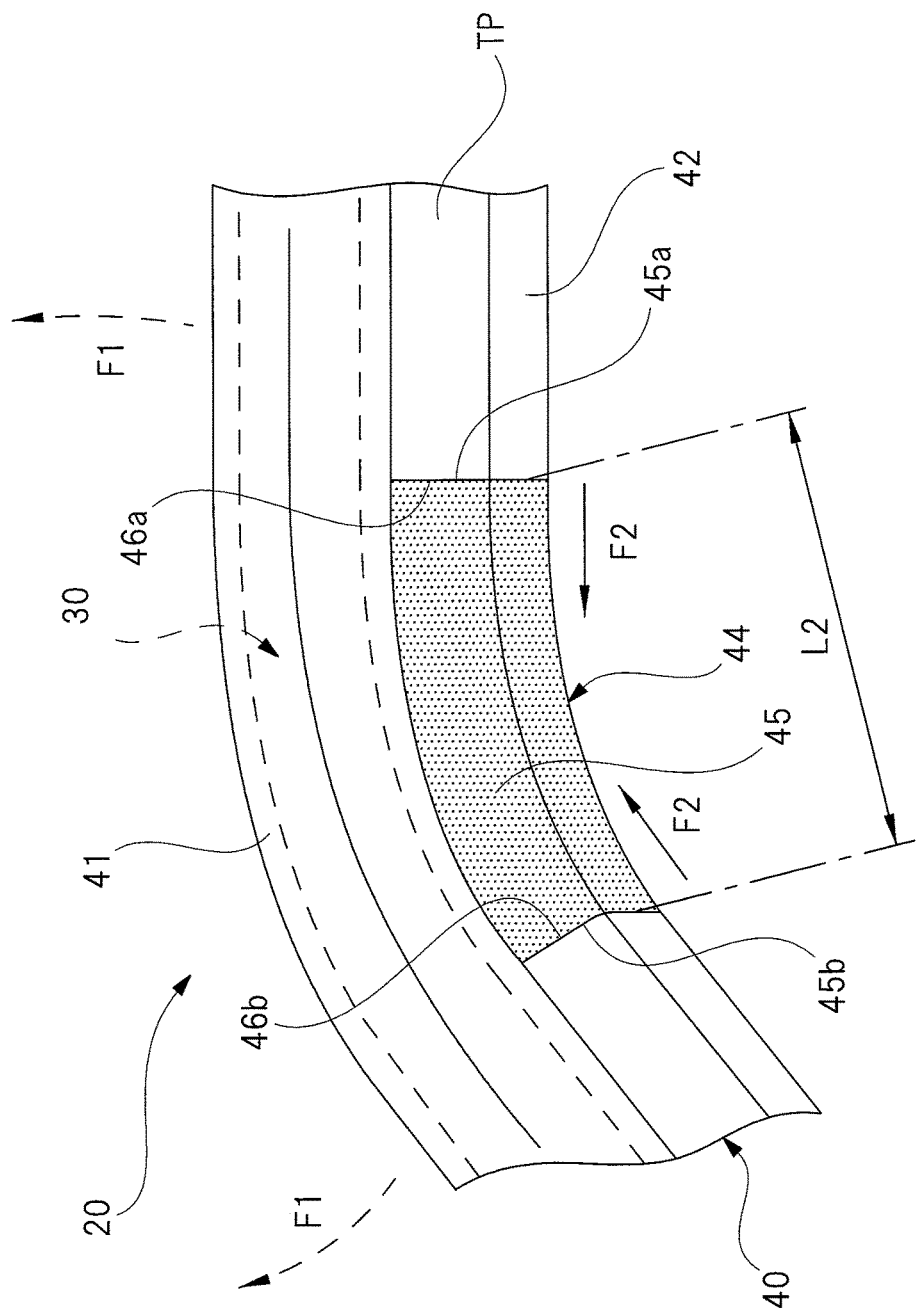

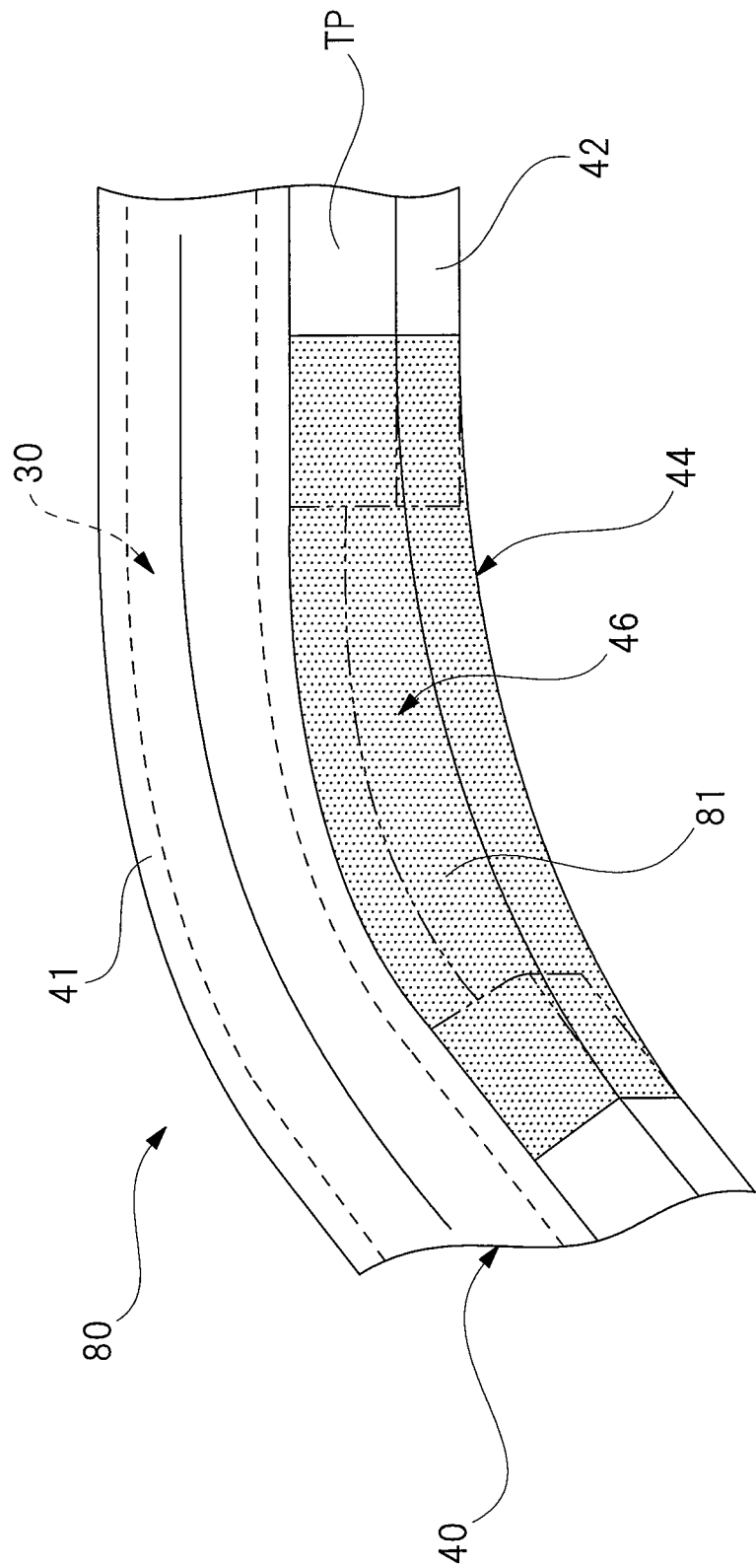

TOUCH SENSOR UNIT AND METHOD OF MANUFACTURING THE SAME

CROSS-REFERENCE TO RELATED APPLICATION

The present application claims priority from Japanese Patent Application No. 2016-094681 filed on May 10, 2016, the content of which is hereby incorporated by reference into this application.

TECHNICAL FIELD OF THE INVENTION

The present invention relates to a touch sensor unit which is used for detection of contact with a blockage, and relates to a method of manufacturing the same.

BACKGROUND OF THE INVENTION

Conventionally, an automatic opening and closing apparatus provided for vehicle such as automotive vehicle has: an opening and closing element which opens and closes an opening portion; an electric motor which drives the opening and closing element; and an operation switch which turns on or off the electric motor. When an operator operates the operation switch, the electric motor is driven so as to open or close the opening and closing element, and the automatic opening and closing apparatus drives the opening and closing element on the basis of not only operation of the operation switch but also other operation conditions.

For example, the automatic opening and closing apparatus uses a touch sensor unit to detect that a blockage is caught between the opening portion and the opening and closing element. The touch sensor unit is fixed to the opening portion or the opening and closing element, and configured to detect the contact with a blockage. Additionally, the automatic opening and closing apparatus opens the opening and closing element under closing operation, or stops the opening and closing element under closing operation on the spot, regardless of the operation of the operation switch, on the basis of a detection signal input from the touch sensor unit.

Patent Document 1 discloses one example of a touch sensor unit which is used for such an automatic opening and closing apparatus. A foreign object detection sensor (touch sensor unit) disclosed in Patent Document 1 is held by a protector (sensor holder) which has a cylindrical sensor holding portion (sensor portion) and an attaching portion (elastic base portion) protruding from an outer circumferential surface of the sensor holding portion to an outer circumferential side of the sensor holing portion.

Additionally, notched portions are formed in portions of the attaching portion along a longitudinal direction thereof, thereby facilitating a curving process of the sensor holding portion along the curved shape of a fixing portion (fixing object), and eventually facilitating attachment with a double-sided adhesive tape (adhesive tape).

RELATED ART DOCUMENTS

Patent Documents

Patent Document 1: Japanese Patent Application Laid-Open Publication No. 2013-092019

SUMMARY OF THE INVENTION

The touch sensor unit disclosed in the above Patent Document 1, however, cannot hold the curved state of the elastic base portion before the elastic base portion is fixed to the fixing object, although the sensor portion can be easily curved. That is, before the elastic base portion is fixed to the fixing object, a restoring force acts on the sensor portion to cause it to return to a straight state, and acts on the elastic base portion so as to straighten the elastic base portion out.

This restoring force hinders the elastic base portion from being fixed to the fixing object, and keeps acting even after the elastic base portion is fixed to the fixing object. For this reason, as the adhesive tape is degraded with age, the restoring force of the sensor portion causes the elastic base portion to peel off the fixing object.

It is an object of the present invention to provide a touch sensor unit which can hold the curved state of an elastic base portion even when the elastic base portion is not fixed to a fixing object, and a method of manufacturing the same.

According to one aspect of the present invention, there is provided a touch sensor unit which is used for detection of contact with a blockage, comprising: a hollow sensor portion which is elastically deformed by an external load; electrodes which are provided inside the sensor portion, and brought into contact with each other by elastic deformation of the sensor portion; an elastic base portion integrally provided with the sensor portion, the elastic base portion extending along a longitudinal direction of the sensor portion, the elastic base portion being fixed the sensor portion to a fixing object; and a curvature holding portion provided on the elastic base portion, and configured to hold a curved state of the sensor portion with the sensor portion deformed in conformity to a curved shape of the fixing object.

According to another aspect of the present invention, in the touch sensor unit, the curvature holding portion may be a resin portion provided in a notched portion on an inner circumferential side of the curved elastic base portion.

According to another aspect of the present invention, in the touch sensor unit, the resin portion may be higher in hardness than the elastic base portion.

According to another aspect of the present invention, in the touch sensor unit, the curvature holding portion may be a cored bar provided inside the elastic base portion, and plastically deformed in conformity to the curved shape of the fixing object.

According to another aspect of the present invention, in the touch sensor unit, the electrodes may be a pair of electrodes helically provided inside the sensor portion.

According to another aspect of the present invention, in the touch sensor unit, an adhesive tape configured to fix the elastic base portion to the fixing object may be bonded to a bottom surface of the elastic base portion.

According to another aspect of the present invention, there is provided a method of manufacturing a touch sensor unit which is used for detection of contact with a blockage, the touch sensor unit comprising: a hollow sensor portion which is elastically deformed by an external load; electrodes which are provided inside the sensor portion, and brought into contact with each other by elastic deformation of the sensor portion; an elastic base portion integrally provided with the sensor portion, the elastic base portion extending along a longitudinal direction of the sensor portion, the elastic base portion being fixed the sensor portion to a fixing object; and a curvature holding portion provided on the elastic base portion, and configured to hold a curved state of the sensor portion with the sensor portion deformed in conformity to a curved shape of the fixing object, the method having steps of: forming a notched portion which forms part of the elastic base portion and extends in a longitudinal direction of the elastic base portion; setting the sensor portion and the elastic base portion in a mold with the notched portion located on an inner circumferential side of the curved elastic base portion; and forming the curvature holding portion in the notched portion by supplying a molten resin into the mold.

According to the present invention, since the elastic base portion is provided with a curvature holding portion which holds the curved state of the sensor portion deformed in conformity to the curved shape of the fixing object, the curved state of the elastic base portion can be held before the elastic base portion is fixed to the fixing object. This can prevent the restoring force of the sensor portion from acting in a direction to peel off the adhesive tape even if the adhesive tape somewhat degrades with age after the elastic base portion in the curved state is fixed to the fixing object with the adhesive tape. Therefore, this makes it possible to facilitate fixing process of the elastic base portion to the fixing object and to keep fixing the touch sensor unit to the fixing object in the initial state over a long time even when the touch sensor unit is fixed with an adhesive tape. It is possible to improve the maintenance cycle of the touch sensor unit and the reliability.

BRIEF DESCRIPTION OF THE DRAWINGS

FIG. 6 is an enlarged perspective view of a portion of the touch sensor unit, which is indicated by a broken line circle "B" in FIG. 1;

FIG. 9 is an enlarged perspective view showing a curvature holding portion according to the third embodiment.

DESCRIPTION OF THE PREFERRED EMBODIMENTS

Hereinafter, the first embodiment of the present invention will be described in detail with reference to the drawings.

Figure 1:
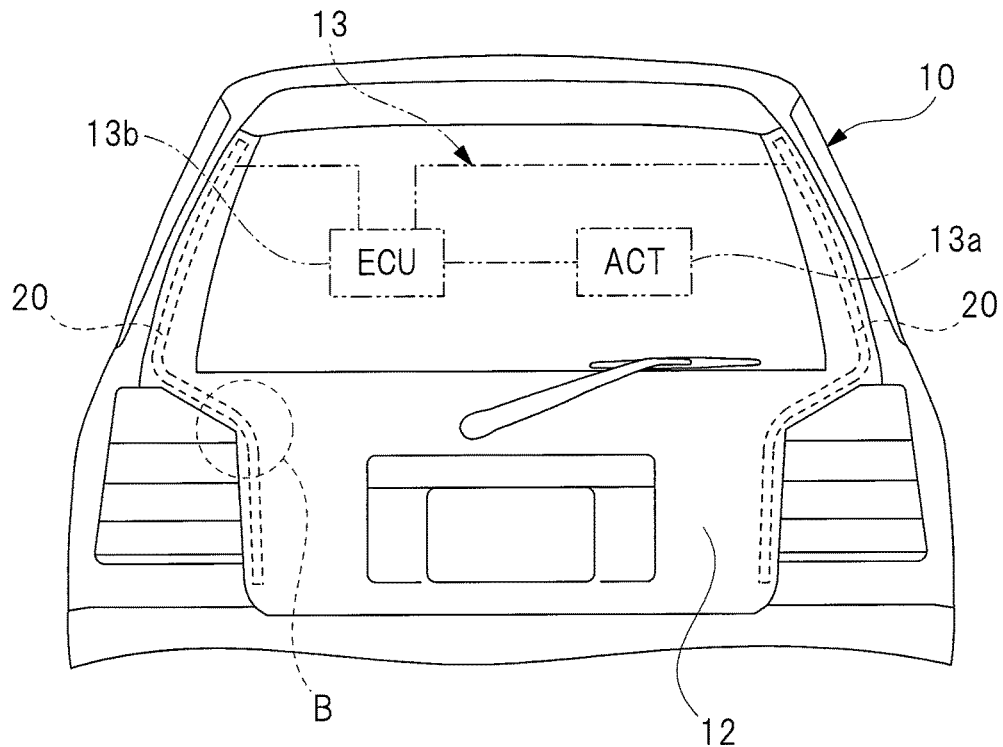
FIG. 1 is a front view of a tail gate including touch sensor units.
Figure 2:
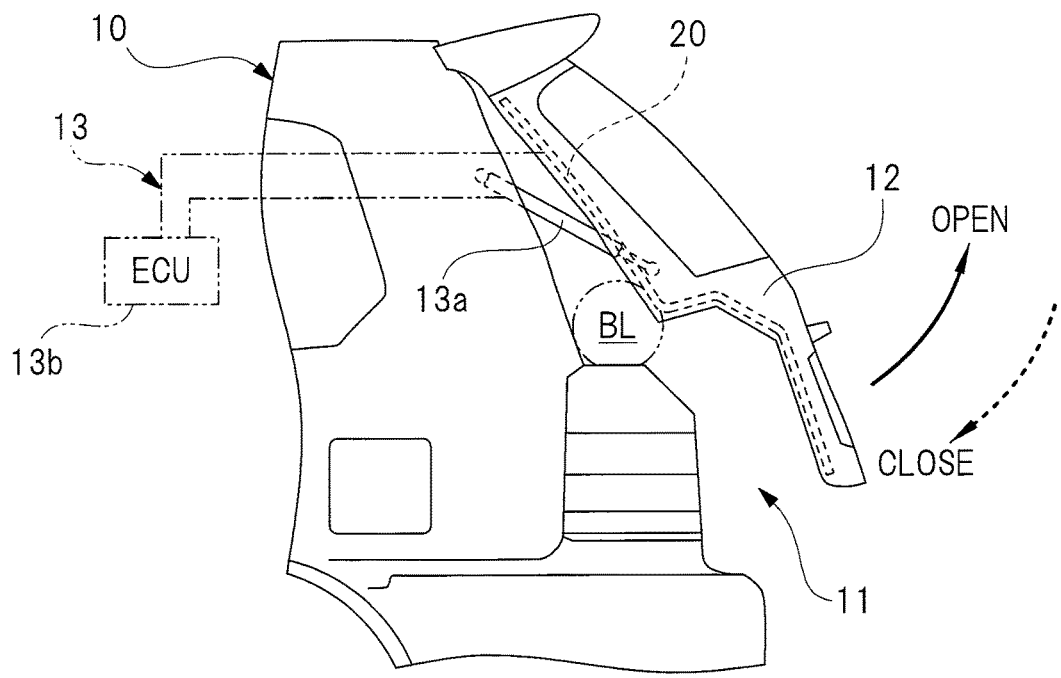
FIG. 2 is a side view of the rear side of a vehicle in FIG. 1, from a lateral side of the vehicle.
Figure 3:
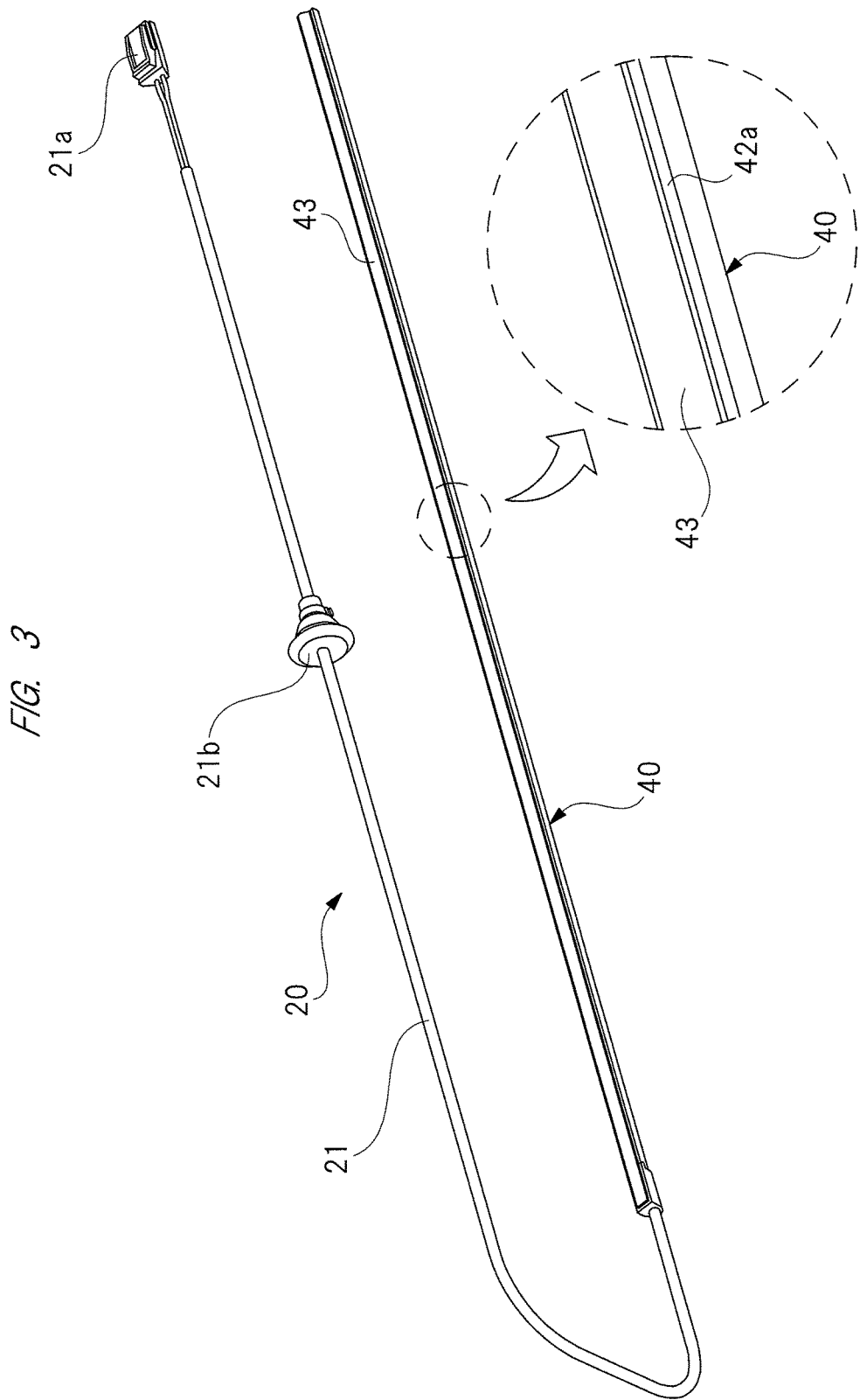
FIG. 3 is a perspective view showing the base end side of the touch sensor unit.
Figure 4:
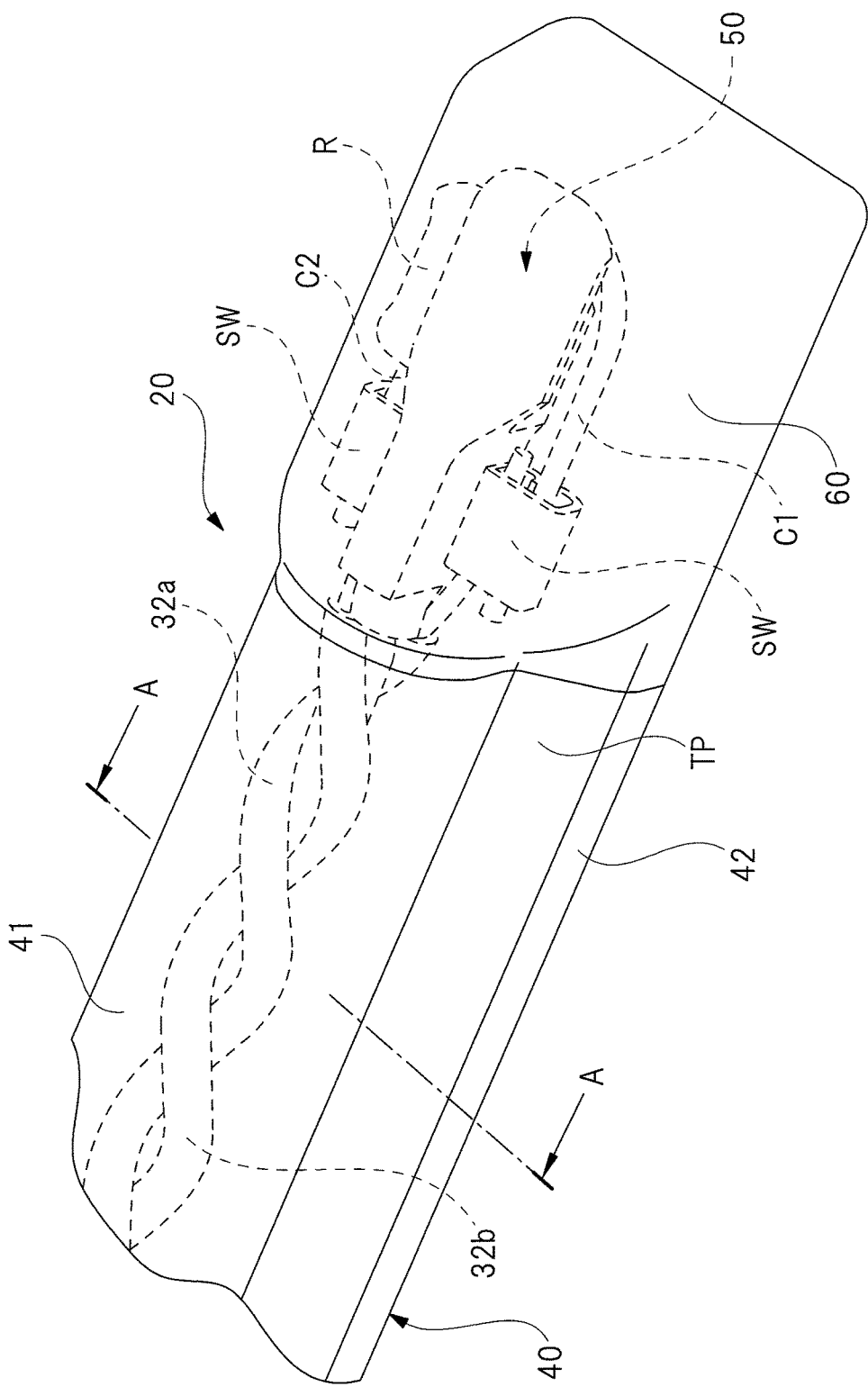
FIG. 4 is a perspective view showing the distal end side of the touch sensor unit.
Figure 5:
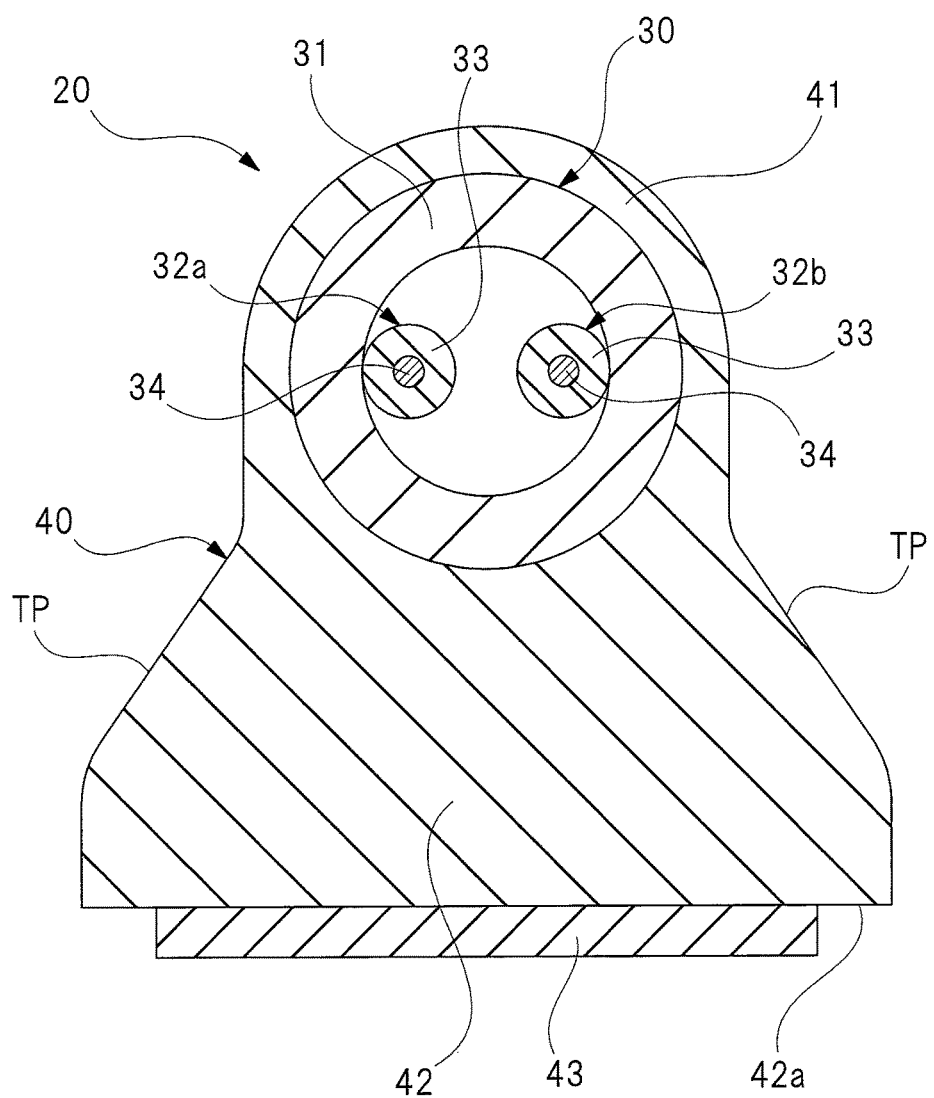
FIG. 5 is a sectional view taken along a line A-A of FIG. 4.
Figure 7A:
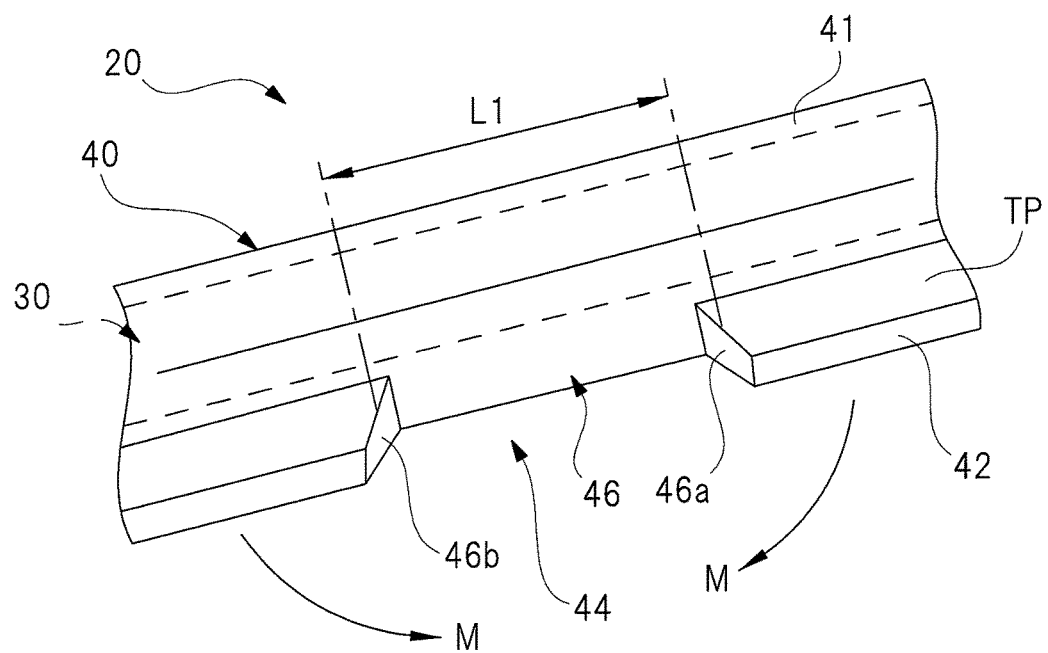
FIGS. 7A and 7B are perspective views for explaining a procedure for molding a curvature holding portion.
Figure 7B:
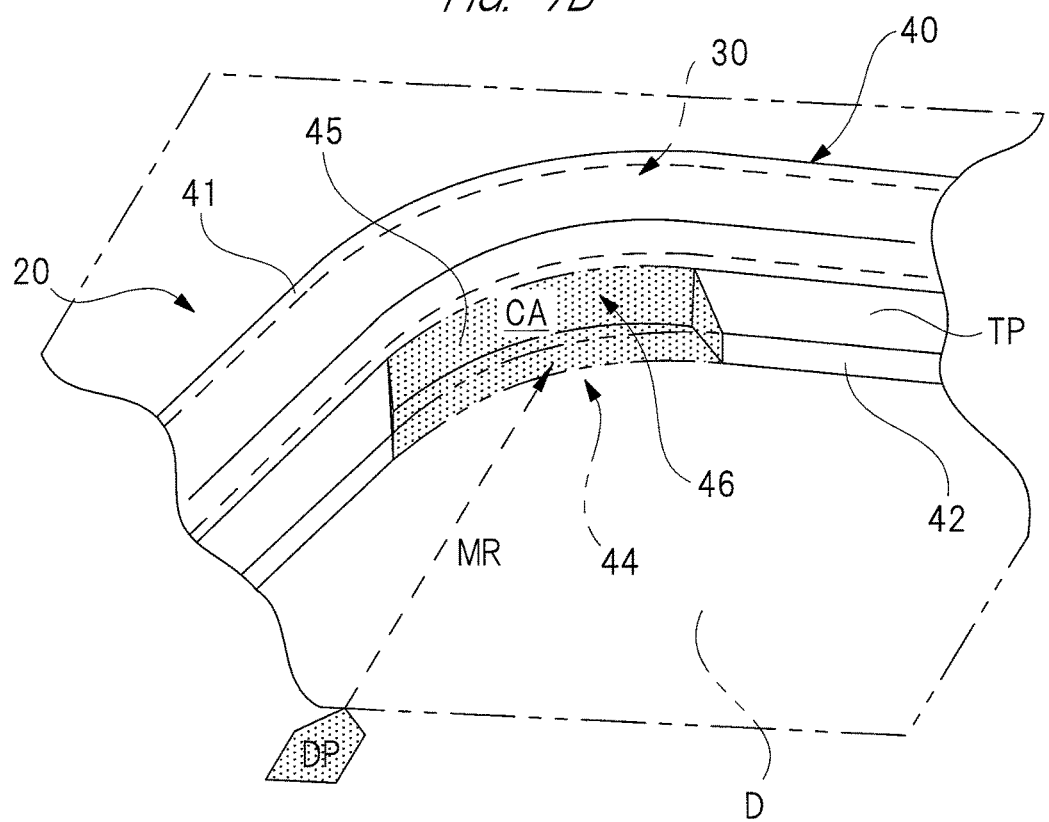

FIG. 1 is a front view of a tail gate including touch sensor units; FIG. 2 is a side view of the rear side of a vehicle in FIG. 1, from a lateral side; FIG. 3 is a perspective view showing the base end side of the touch sensor unit; FIG. 4 is a perspective view showing the distal end side of the touch sensor unit; FIG. 5 is a sectional view taken along a line A-A of FIG. 4; FIG. 6 is an enlarged perspective view of a portion of the touch sensor unit, which is indicated by a broken line circle "B" in FIG. 1; and FIGS. 7A and 7B are perspective views for explaining a procedure for molding a curvature holding portion.

A vehicle 10 shown in FIGS. 1 and 2 is of a so-called hatch back type. The vehicle 10 has an opening portion 11 formed in the rear side, which allows a large piece of baggage to be taken in and out of the vehicle interior. The opening portion 11 is opened and closed, as indicated by the solid line arrow and the broken line arrow in FIG. 2, with a tail gate (opening and closing element) 12 which pivots about a hinge (not shown) provided on the rear side of the ceiling portion of the vehicle 10.

A power tail gate apparatus 13 is mounted on the vehicle 10 according to this embodiment. The power tail gate apparatus 13 includes: an actuator 13a equipped with a decelerator, the actuator opening and closing the tail gate 12; a controller 13b which controls the actuator 13a on the basis of an operation signal from an operation switch (not shown); and a pair of touch sensor units 20 which detect the contact of a blockage BL.

As shown in FIG. 1, the touch sensor units 20 are respectively provided on both sides (right and left sides in FIG. 1) of the tail gate 12 as a "fixing object" in a width direction of the vehicle. More specifically, the pair of touch sensor units 20 are arranged along the curved shape of a door frame on the both sides of the tail gate 12 in the width direction. That is, the pair of touch sensor units 20 are formed into a curved state in conformity to the curved shape of the door frame, and are fixed, in the curved state, to the tail gate 12. Therefore, when the blockage BL comes into contact with the touch sensor units 20 between the opening portion 11 and the tail gate 12, the touch sensor units 20 are immediately deformed elastically.

Each touch sensor unit 20 is electrically connected to the controller 13b, and inputs, to the controller 13b, a detection signal generated by elastic deformation of the touch sensor unit 20. The controller 13b opens the tail gate 12 under closing operation or stops the tail gate 12 under closing operation on the spot, regardless of the operation of the operation switch, on the basis of the detection signal from each touch sensor unit 20. This prevents the blockage BL from being caught.

As shown in FIG. 4, each touch sensor unit 20 is provided with a pair of electrodes 32a and 32b, and a resistor "R" is electrically connected to the distal end side (right side in FIG. 4) of the touch sensor unit 20. Therefore, when the touch sensor unit 20 is not elastically deformed, the pair of electrodes 32a and 32b is not in contact with each other, and the resistance value of the resistor R is input to the controller 13b. That is, when receiving the resistance value of the resistor R, the controller 13b determines that the blockage BL is not caught, and continues to close the tail gate 12.

On the other hand, when the blockage BL comes into contact with each touch sensor unit 20, and the touch sensor unit 20 is then elastically deformed, the pair of electrodes 32a and 32b comes into contact with each other to be short-circuited. A resistance value (infinite) is input to the controller 13b without via the resistor R. Therefore, the controller 13b detects a change in resistance value and executes control to open the tail gate 12 or stop the tail gate 12 on the spot in response to the change in resistance value as a "trigger".

As shown in FIGS. 3 to 6, each touch sensor unit 20 includes a sensor body 30 and a sensor holder 40 which holds the sensor body 30. Additionally, as shown in FIG. 3, a wiring 21 is provided on the base end side of the touch sensor unit 20, and a male connector 21a to be attached to a female connector (not shown) of the controller 13b is provided on the distal end portion of the wiring 21. Furthermore, a rubber grommet 21b to be fixed in a fixing hole (not shown) provided in the tail gate 12 is provided at a substantially middle portion of the wiring 21 extending along the longitudinal direction. With this configuration, a sealing is provided between the same side as the sensor holder 40 disposed outside the vehicle and the same side as the male connector 21*a* disposed inside the vehicle.

As shown in FIG. 5, each sensor body 30 includes an insulating tube 31 formed of insulating rubber material or the like having flexibility. The insulating tube 31 is elastically deformable by an external load. The pair of electrodes 32*a* and 32*b* are helically fixed to the radial inner side (inside) of the insulating tube 31. The electrodes 32*a* and 32*b* include conductive tubes 33 formed of conductive rubber or the like having flexibility, each accommodating a conductive line 34 formed from a bundle of a plurality of copper wires. As shown in FIG. 5, the inner diameter of the insulating tube 31 is almost three times the diameter of each of the electrodes 32*a* and 32*b*. That is, a gap almost corresponding to each of the electrodes 32*a* and 32*b* is formed between the electrodes 32*a* and 32*b* facing each other through the axis of the insulating tube 31.

As described above, the electrodes 32*a* and 32*b* are arranged on the radial inner side of each insulating tube 31 at angular intervals of 180 degrees in the circumferential direction of the insulating tube 31, and are helically fixed to the radial inner side in the longitudinal direction of the insulating tube 31. Additionally, the gap almost corresponding to each of the electrodes 32*a* and 32*b* is formed between the electrodes 32*a* and 32*b* facing each other through the axis of the insulating tube 31. This structure makes the electrodes 32*a* and 32*b* come into contact with each other and be short-circuited under almost the same condition (pressing force) regardless of the position in the circumferential direction of the sensor body 30 at which the blockage BL (see FIG. 1) comes into contact with the sensor body 30 to elastically deform it.

Here, in each touch sensor unit 20 used for the tail gate 12, the insulating tube 31 has a diameter of about 5 mm. Consequently, in consideration of the routing and detection sensitivity of the touch sensor unit 20 with respect to the tail gate 12, the pair of electrodes 32*a* and 32*b*, each having a diameter of about 1 mm, are preferably provided, in a helical fashion, inside the insulating tube 31. For example, in this embodiment, even when the insulating tube 31 was wound on a columnar support having a radius of 4 mm, the electrodes 32*a* and 32*b* were not short-circuited. On the other hand, in a comparative example, when the same insulating tube 31 accommodating the same four electrodes arranged in parallel was wound on a columnar support having a radius of 7.5 mm, the respective electrodes were short-circuited. In other words, the embodiment using the former structure can cope with the door frame of the tail gate 12 with curved shape having any angles from acute angles to obtuse angles.

As shown in FIGS. 4 to 6, each sensor holder 40 is formed into an elongated shape by, for example, extrusion of an insulating rubber material having flexibility. The sensor holder 40 includes a hollow sensor portion 41 internally holding the sensor body 30, and a base portion 42 fixed to the tail gate 12 (see FIG. 1).

Each sensor portion 41 extending along a direction (transverse direction) intersecting with the longitudinal direction of the sensor holder 40 has an almost semicircular cross-sectional shape. The wall thickness of the sensor portion 41 is smaller than that of the insulating tube 31, and smallest among those of the remaining portions of the sensor holder 40. That is, the sensor portion 41 can easily deform elastically upon receiving an external load. Consequently, the elastic deformation of the sensor portion 41 can cause the electrodes 32*a* and 32*b* held by the sensor portion 41 via the insulating tube 31 to easily come into contact with each other, thereby ensuring sufficient detection performance of the sensor body 30.

The base portion 42 is integrally provided to the sensor portion 41 and extends along its longitudinal direction, and the base portion 42 has a function of fixing the sensor portion 41 to the tail gate 12. That is, the base portion 42 forms an "elastic base portion" in the present invention. The base portion 42 has an almost trapezoidal cross-sectional shape along the transverse direction of the sensor holder 40. A double-sided adhesive tape (adhesive tape) 43 is bonded to a bottom surface 42*a* of the base portion 42 to fix the sensor holder 40 to the tail gate 12.

Here, as shown in FIG. 5, the width of the sensor portion 41 along the lateral direction in FIG. 5 is smaller than that of the base portion 42. Additionally, the sensor portion 41 and the base portion 42 are coupled to each other through a pair of tapered surfaces TP so as to be smoothly coupled to each other. This can prolong the service life of the sensor holder 40 by preventing stress from focusing between the sensor portion 41 and the base portion 42.

As described above, each sensor holder 40 has a noncircular cross-sectional shape in a direction (transverse direction) intersecting with the longitudinal direction of the sensor body 30 (insulating tube 31). This facilitates the elastic deformation of the sensor portion 41 and makes the base portion 42 have sufficient rigidity, thereby ensuring the fixing strength with which the sensor portion 41 is fixed to the tail gate 12 with the double-sided adhesive tape 43.

Here, as shown in FIG. 4, the distal end side of each touch sensor unit 20 is provided with a separator 50 made of insulating material, the single resistor R, and two caulking members SW. The separator 50, the resistor R, and the caulking members SW are buried in a mold resin 60 by insert molding.

Two ends of each resistor R are respectively provided with a long connecting portion C1 and a short connecting portion C2. The long connecting portion C1 is folded through 180° with respect to the short connecting portion C2 to electrically connect the long connecting portion C1 and the short connecting portion C2 to the conductive lines 34 (see FIG. 5) of the electrodes 32*a* and 32*b*, respectively, with the caulking members SW. In this manner, the ends of the electrodes 32*a* and 32*b* are electrically connected to each other via the resistor R.

Note that since each caulking member SW is caulked by a caulking tool (not shown) such as lineman's pliers, the resistor R is firmly, electrically connected to the conductive lines 34 of the electrodes 32*a* and 32*b*. The caulking members SW are symmetrically arranged on respective sides of the separator 50 so as to be prevented from being short-circuited to each other at the corresponding portion of the separator 50.

For example, as indicated by the portion indicated by a broken line circle "B" in FIG. 1, each sensor holder 40 extends along the curved shape of the door frame of the tail gate 12 to be fixed to the tail gate 12 with the double-sided adhesive tape 43 while being curved at a predetermined angle. Specifically, as shown in FIG. 6, a curved portion 44 is formed at a curved portion of the base portion 42 of the sensor holder 40. The curved portion 44 is formed in advance at a manufacturing stage of the sensor holder 40. Consequently, when the sensor holder 40 is fixed to the tail gate 12 (see FIG. 1), the sensor holder 40 needs not be elastically deformed, thereby improving the workability in fixing the base portion 42 to the tail gate 12.

As indicated by the hatched portion in FIG. 6, each curved portion 44 is formed from a hard resin portion (resin portion) 45. The hard resin portion 45 forms a curvature holding portion according to the present invention, and is formed of rubber material harder than the sensor holder 40. The hard resin portion 45 is formed into a curved shape in conformity to the curved shape of the door frame of the tail gate 12, and is provided on the radial inner side (lower side in FIG. 6) of the base portion 42 which is in the curved state. More specifically, the hard resin portion 45 is provided so as to fill a notched portion 46 (see FIG. 7A) formed in the base portion 42.

A first wall portion 45a welded to a first side wall portion 46a (right side in FIG. 6) of the notched portion 46 is formed on one side (right side in FIG. 6) of the hard resin portion 45 in the longitudinal direction. On the other hand, a second wall portion 45b welded to a second side wall portion 46b (left side in FIG. 6) of the notched portion 46 is formed on the other side (left side in FIG. 6) of the hard resin portion 45 in the longitudinal direction. Here, the hard resin portion 45 is formed by forming the notched portion 46 in the base portion 42 and then charging (supplying) a molten resin into the notched portion 46. The first side wall portion 46a and the first wall portion 45a are texturally integrated with each other and firmly bonded to each other by the heat of the molten resin, and the second wall portion 46b and the second wall portion 45b are also texturally integrated with each other and firmly bonded to each other by the heat of the molten resin.

As shown in FIG. 7A, the sensor holder 40 is a straight state, and a distance L1 between the first side wall portion 46a and the second side wall portion 46b of the notched portion 46 is larger than a width L2 of the hard resin portion 45 along the longitudinal direction (L1>L2). Consequently, as shown in FIG. 6, the hard resin portion 45 holds the curved state of the sensor portion 41 formed into a curved shape in conformity to the curved shape of the door frame of the tail gate 12.

Note that the hard resin portion 45 is formed of rubber material harder than the sensor holder 40 to pull the sensor holder 40 with a tensile force F2 against a restoring force F1 that causes the sensor holder 40 to return to the straight state. This makes it possible to effectively hold the curved state of the sensor holder 40. However, taking in consideration that the hard resin portion 45 extends somewhat because of the restoring force F1, when the hard resin portion 45 is molded, the sensor holder 40 is preferably curved at an angle slightly smaller than the angle at which the tail gate 12 is actually curved, thereby improving the workability in fixing the base portion 42 to the tail gate 12.

Next, a method of manufacturing each touch sensor unit 20 formed in the above manner, in particular, a procedure for molding the hard resin portion 45, will be described in detail with reference to the accompanying drawings.

First of all, as shown in FIG. 7A, the sensor holder 40 having the sensor body 30 mounted on the sensor portion 41 is prepared, and is cut by a predetermined length in accordance with the door frame of the tail gate 12 (see FIG. 1) to which the touch sensor unit 20 is fixed. Then, that portion of the base portion 42 which extends along the longitudinal direction and corresponds to the curved portion 44 of the sensor holder 40 is notched by using a utility knife or the like to form the notched portion 46 shown in FIG. 7A.

Subsequently, as indicated by arrows "M" in FIG. 7A, the sensor holder 40 is curved. At this time, the notched portion 46 is placed on the radial inner side (inner circumferential side) of the curved sensor holder 40. Forming the notched portion 46 can reduce the volume of the elastically deformed portion of the base portion 42 and the rigidity of the sensor holder 40. This facilitates curving the sensor holder 40.

Additionally, since elastically deformed portion of the base portion 42 is small in volume, it is possible to prevent any excessive load from being applied to the sensor portion 41. Consequently, by forming the curved portion 44 on the sensor holder 40, the electrodes 32a and 32b (see FIGS. 4 and 5) inside the sensor portion 41 are prevented from short-circuiting. It is therefore possible to reliably prevent any false detection after completion of the touch sensor unit 20.

Subsequently, as shown in FIG. 7B, with the curved base portion 42 of the sensor holder 40, the overall sensor holder 40 including the sensor portion 41 is set inside upper and lower molds D (not shown in detail). This forms a cavity CA (hatched portion in FIG. 7B) for forming the curved portion 44 in that portion inside the upper and lower molds D which corresponds to the notched portion 46.

A molten resin MR forming the hard resin portion 45 is then supplied (the broken line arrow in FIG. 7B) from a dispenser DP into a supply path (not shown) formed in the upper and lower molds D, and is charged into the cavity CA with a predetermined pressure without any space left. This forms the hard resin portion 45 in the notched portion 46 and completes the formation of the curved portion 44 at a predetermined portion of the sensor holder 40 along the longitudinal direction, as indicated by the hatched portion in FIG. 7B. Note that after the hard resin portion 45 is completely cooled and cured, the upper and lower molds D are released from each other.

As described above in detail, according to this embodiment, since each base portion 42 is provided with a hard resin portion 45 which holds the curved state of the sensor portion 41 deformed in conformity to the curved shape of the door frame of the tail gate 12, the curved state of the base portion 42 can be held even while the base portion 42 is not fixed to the tail gate 12. This prevents the restoring force F1 of the sensor portion 41 from acting in a direction to peel off the double-sided adhesive tape 43 even if the double-sided adhesive tape 43 degrades with age after the base portion 42 is fixed, in the curved state, to the tail gate 12 with the double-sided adhesive tape 43.

It is therefore possible to further facilitate fixing the base portion 42 to the tail gate 12 and fix each touch sensor unit 20 to the tail gate 12 in the initial state for a long time even when the touch sensor unit 20 is fixed to the tail gate 12 by using the double-sided adhesive tape 43. This can prolong the maintenance cycle of the touch sensor unit 20 and improve the reliability.

Additionally, in this embodiment, since the hard resin portion 45 is formed as a "curvature holding portion" according to the present invention so as to fill the notched portion 46 formed in the inner circumferential side of the curved base portion 42, a portion provided with the curved portion 44 is not formed with any stepped portions after the completion of each touch sensor unit 20, thereby enabling the touch sensor unit 20 to have a good appearance.

Additionally, according to this embodiment, since the hard resin portion 45 has higher hardness than the base portion 42, it is possible to more effectively hold the curved state of the sensor holder 40. This can further improve the workability in fixing the base portion 42 to the tail gate 12.

Furthermore, this embodiment provides the pair of electrodes 32a and 32b helically inside each sensor portion 41, and hence can make the electrodes 32a and 32b come into contact with each other and short-circuit to each other under almost the same condition regardless of the position along the circumferential direction of the sensor body 30 at which the blockage BL comes into contact with the sensor body 30. That is, the detection performance of the touch sensor unit 20 can be improved.

Next, the second embodiment of the present invention will be described in detail with reference to the drawings. Here, portions the same in function as those of the first embodiment are respectively denoted by the same reference numbers as those of the first embodiment, and detail description thereof is omitted in this embodiment.

Figure 8A:
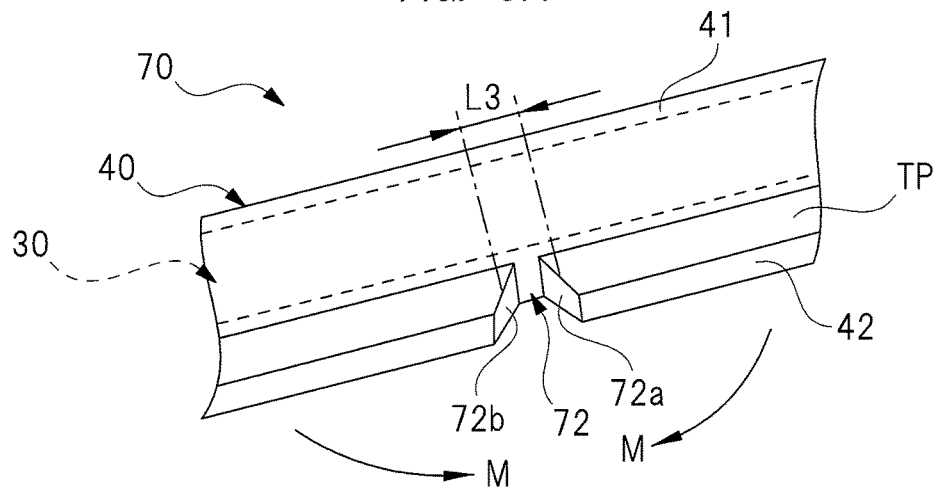
FIGS. 8A, 8B, and 8C are perspective views for explaining a procedure for molding the curvature holding portion in the second embodiment.
Figure 8B:
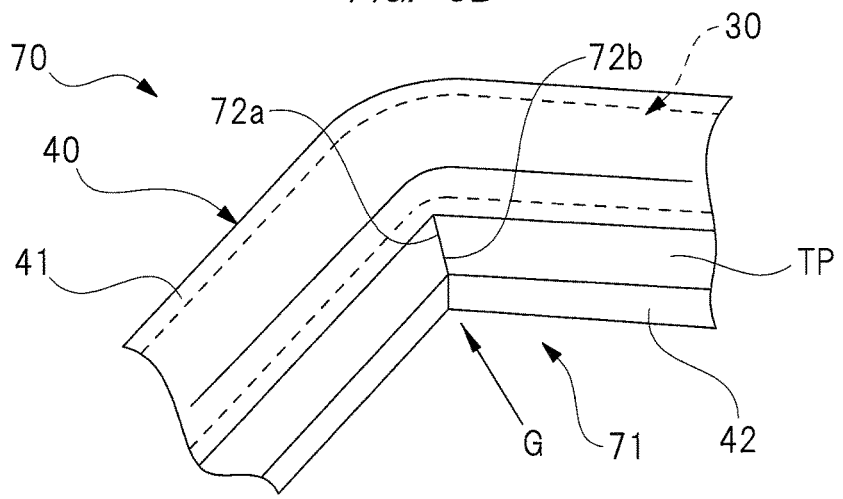
Figure 8C:
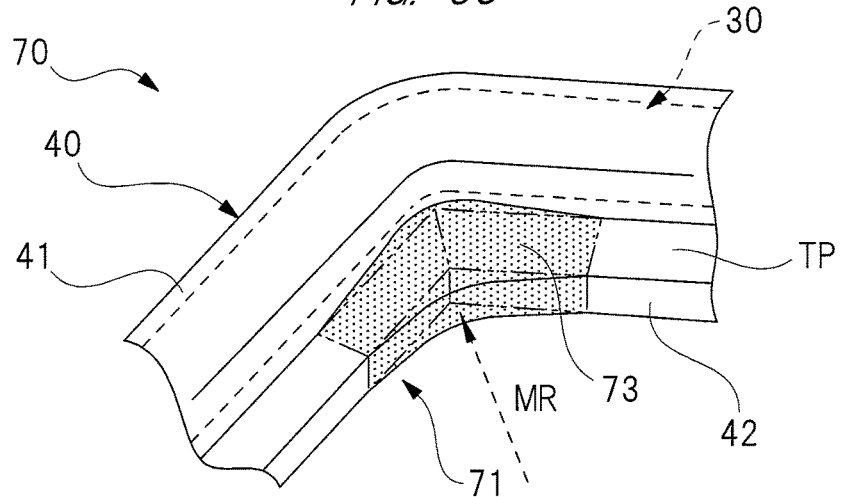

FIGS. 8A, 8B, and 8C are perspective views for explaining a procedure for molding the curvature holding portion in the second embodiment.

As shown in FIG. 8, touch sensor units 70 according to the second embodiment differ from the touch sensor units 20 (see FIG. 7) according to the first embodiment in that the angle of a curved portion 71 is small and close to 90°, a distance L3 between a first side wall portion 72a and a second side wall portion 72b of a notched portion 72 is short (L3<L1), the wall portions 72a and 72b abut on each other, and a hard resin portion (curvature holding portion or resin portion) 73 (hatched portion in FIG. 8C) is provided so as to cover a portion surrounding and including the notched portion 72 with the wall portions 72a and 72b made to abut on each other.

Specifically, a sensor holder 40 is curved as indicated by arrows "M" in FIG. 8A, and the first side wall portion 72a and the second side wall portion 72b are made to abut on each other as shown in FIG. 8B. In this state, as in the first embodiment, a molten resin MR is supplied (the broken line arrow in FIG. 8C) into the cavity (not shown) between upper and lower molds. This procedure forms the hard resin portion 73 without forming any stepped portions so as to cover a portion surrounding and including the notched portion 72, that is, a portion surrounding the abutment surface between the respective wall portions 72a and 72b.

Note, however, that an adhesive agent "G" may be applied between the wall portions 72a and 72b while they abut on each other, as indicated by the solid line arrow in FIG. 8B. This facilitates holding the curved state of the sensor holder 40 curved at an angle more acute than that in the first embodiment, especially before the molten resin MR is supplied into the cavity between the upper and lower molds.

The second embodiment formed in the above manner can provide the same functions and effects as those of the first embodiment described above.

Next, the third embodiment of the present invention will be described in detail with reference to the drawings. Here, portions the same in function as those of the first embodiment are respectively denoted by the same reference numbers as those of the first embodiment, and detail description thereof is omitted in this embodiment.

FIG. 9 is an enlarged perspective view showing a curvature holding portion in the third embodiment.

As shown in FIG. 9, in contrast to the touch sensor units 20 (see FIG. 6) according to the first embodiment, touch sensor units 80 according to the third embodiment are configured such that each hard resin portion (curvature holding portion or resin portion) 81 (hatched portion in FIG. 9) is formed so as to cover a portion surrounding and including a notched portion 46 without forming any stepped portions. That is, in contrast to the hard resin portion 45 according to the first embodiment, the hard resin portion 81 according to the third embodiment is provided so as to extend in a wider range along the longitudinal direction of each touch sensor unit 80.

The third embodiment formed in the above manner can provide the same functions and effects as those of the first embodiment described above. Additionally, in the third embodiment, since the hard resin portion 81 is provided so as to extend in a wider range along the longitudinal direction of the touch sensor unit 80, the rigidity of a curved portion 44 can be increased. This makes it possible to more reliably hold the curved state of the touch sensor unit 80.

Next, the fourth embodiment of the present invention will be described in detail with reference to the drawings. Here, portions the same in function as those of the first embodiment are respectively denoted by the same reference numbers as those of the first embodiment, and detail description thereof is omitted in this embodiment.

Figure 10:
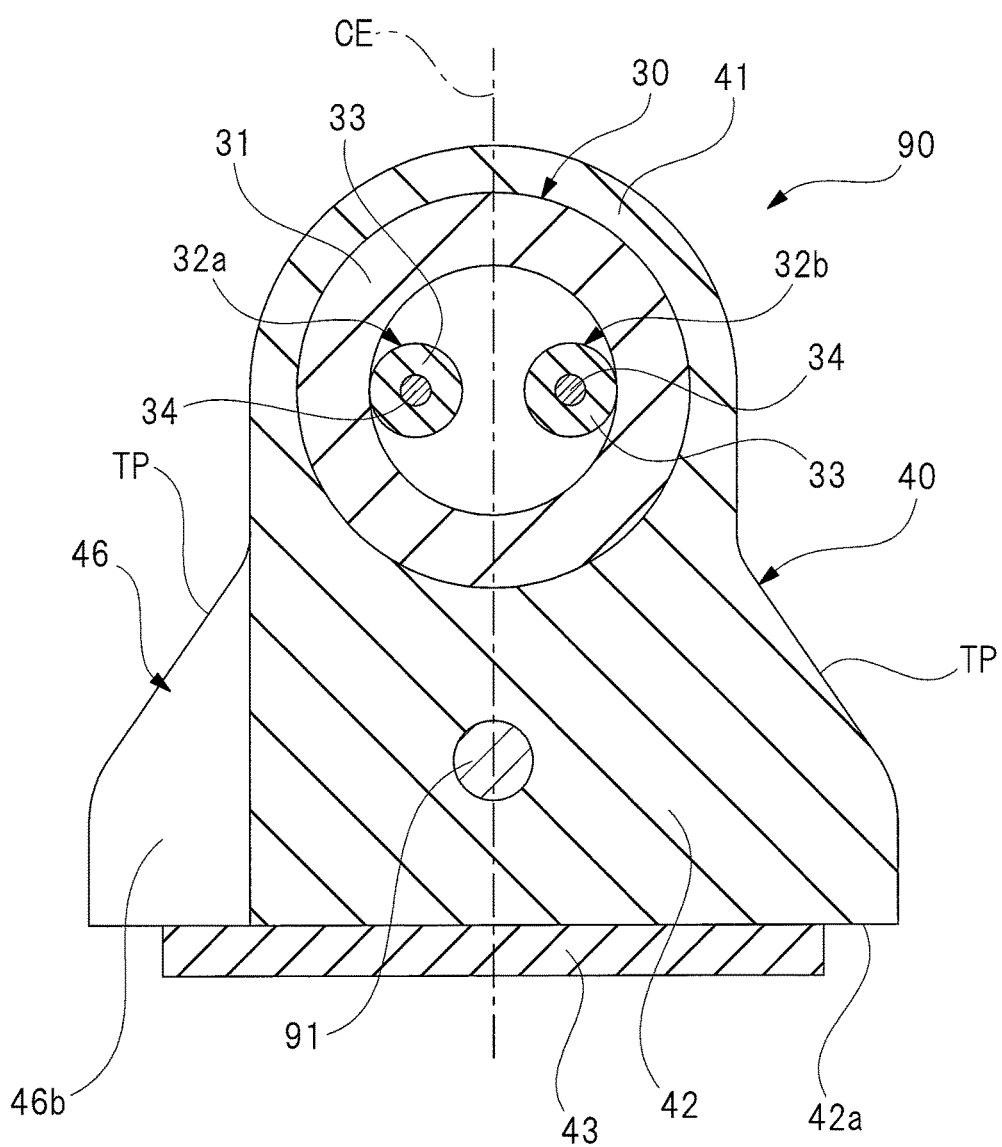
FIG. 10 is a sectional view showing a curvature holding portion according to the fourth embodiment.

FIG. 10 is a sectional view showing a curvature holding portion in the fourth embodiment.

As shown in FIG. 10, touch sensor units 90 according to the fourth embodiment differ from the touch sensor units 20 (see FIG. 6) according to the first embodiment in that each hard resin portion 45 is omitted, and a cored bar 91 made of metal is buried in a portion of a base portion 42, which corresponds to a notched portion 46. This cored bar 91 forms a curvature holding portion according to the present invention, and is buried in the base portion 42 at the time of molding a sensor holder 40.

Here, each cored bar 91 is disposed on a central axis CE of the touch sensor unit 90, thereby facilitating curving the touch sensor unit 90. At the time of assembling the touch sensor unit 90, plastically deforming the cored bar 91 so as to curve it at a predetermined angle can curve the touch sensor unit 90 in conformity to the curved shape of the door frame of a tail gate 12 (see FIG. 1) in advance. Note that the cored bar 91 may be provided in an entire area along the longitudinal direction of the sensor holder 40 instead of being locally provided as in the above case.

As in the first embodiment described above, in the fourth embodiment formed in the above manner, each touch sensor unit can be formed in advance into a curved state in conformity to the curved shape of the door frame of the tail gate 12. Additionally, the fourth embodiment eliminates the necessity of injection molding of the molten resin MR (see FIG. 7), and can simplify the manufacturing process. Note that the shape of the cored bar 91 is not limited to a shape with a circular cross section and may be a shape with a polygonal cross section, as shown in FIG. 10. Furthermore, the number of cored bars 91 to be provided in each touch sensor unit is not limited to one, and a plurality of cored bars may be provided or the thickness of each cored bar may be changed in accordance with the required rigidity.

Obviously, the present invention is not limited to each embodiment described above and can be variously changed without departing from the scope of the invention. For example, each embodiment described above has exemplified the structure having the pair of electrodes 32a and 32b helically fixed inside the insulating tube 31. However, the present invention is not limited to this structure, and can also be configured to provide, for example, four or six electrodes in a helical state in accordance with the thickness of each electrode or the required detection performance.

Additionally, each embodiment described above has exemplified the case in which the touch sensor units 20, 70, 80, or 90 are attached to the tail gate 12 of the vehicle 10. However, the present invention is not limited to this, and such touch sensor units can also be attached to the sliding roof or the sliding doors on the lateral sides of the vehicle. Furthermore, such touch sensor units can be attached to, for example, an automatic door which opens and closes a doorway of a building as well as an opening and closing element provided for the vehicle.

Material, shape, dimension, number, installation position, and others of each constructional element of each embodiment described above can be arbitrarily determined as long as the present invention can be implemented, and are not limited to those of the above embodiments.

What is claimed is:

1. A touch sensor unit which is used for detection of contact with a blockage, comprising:
   a hollow sensor portion which is elastically deformed by an external load;
   electrodes which are provided inside the sensor portion, and brought into contact with each other by elastic deformation of the sensor portion;
   an elastic base portion integrally provided with the sensor portion, the elastic base portion extending along a longitudinal direction of the sensor portion, the elastic base portion being fixed the sensor portion to a fixing object;
   a curvature holding portion provided on the elastic base portion, and configured to hold a curved state of the sensor portion with the sensor portion deformed in conformity to a curved shape of the fixing object;
   a width of the sensor portion along a transverse direction being smaller than that of the elastic base portion along a transverse direction;
   the curvature holding portion being a cored bar which is provided inside the elastic base portion and is plastically deformed in conformity to the curved shape of the fixing object; and
   a line segment which connects a center of the sensor portion and a center of the cored bar being perpendicular to a bottom surface of the elastic base portion.

2. The touch sensor unit according to claim 1, wherein the electrodes are a pair of electrodes helically provided inside the sensor portion.

3. The touch sensor unit according to claim 1, wherein an adhesive tape configured to fix the elastic base portion to the fixing object is bonded to the bottom surface of the elastic base portion.

4. A method of manufacturing a touch sensor unit which is used for detection of contact with a blockage,
   the touch sensor unit comprising:
      a hollow sensor portion which is elastically deformed by an external load;
      electrodes which are provided inside the sensor portion, and brought into contact with each other by elastic deformation of the sensor portion;
      an elastic base portion integrally provided with the sensor portion, the elastic base portion extending along a longitudinal direction of the sensor portion, the elastic base portion being fixed the sensor portion to a fixing object; and
      a curvature holding portion provided on the elastic base portion, and configured to hold a curved state of the sensor portion with the sensor portion deformed in conformity to a curved shape of the fixing object,
   the method having steps of:
      forming a notched portion which forms part of the elastic base portion and extends in a longitudinal direction of the elastic base portion;
      setting the sensor portion and the elastic base portion in a mold with the notched portion located on an inner circumferential side of the curved elastic base portion; and
      forming the curvature holding portion in the notched portion by supplying a molten resin into the mold.

* * * * *